(12) United States Patent
MacPherson et al.

(10) Patent No.: US 6,369,437 B1
(45) Date of Patent: Apr. 9, 2002

(54) VERTICAL FUSE STRUCTURE FOR INTEGRATED CIRCUITS AND A METHOD OF DISCONNECTING THE SAME

(75) Inventors: John MacPherson, Fremont; Alan H. Huggins, Gilroy; Richard J. Schmidley, San Jose, all of CA (US)

(73) Assignee: Clear Logic, Inc., San Jose, CA (US)

( * ) Notice: Subject to any disclaimer, the term of this patent is extended or adjusted under 35 U.S.C. 154(b) by 0 days.

(21) Appl. No.: 09/229,040

(22) Filed: Jan. 12, 1999

(51) Int. Cl.$^7$ .............................................. H01L 29/00
(52) U.S. Cl. ...................... 257/529; 257/665; 257/209
(58) Field of Search ................................. 257/173, 529, 257/665, 209

(56) References Cited

U.S. PATENT DOCUMENTS 5,955,751 A * 9/1999 Shroff et al. ................. 257/209
6,008,716 A * 12/1999 Kokubun ..................... 337/297
6,066,896 A * 5/2000 Wada et al. .................. 257/758

* cited by examiner

*Primary Examiner*—Nathan Flynn
*Assistant Examiner*—Scott R. Wilson
(74) *Attorney, Agent, or Firm*—Pillsbury Winthrop LLP

(57) ABSTRACT

A vertical fuse structure and methods for customization of integrated circuits include a substantially vertically-oriented interconnect structure or "fuse" which provides for a more densely packed and thus smaller programmable integrated circuit. In a preferred embodiment, a vertical interconnect structure is fabricated by forming a first interconnect layer, forming an insulating layer over the first interconnect layer in which substantially vertically-oriented vias are patterned in contact with the first interconnect layer, filling the vias with a conductive plug, and forming a second interconnect layer over the insulating layer in contact with the conductive plug. The vertical interconnect structure is preferably disconnected by forming a narrow, substantially vertical disconnect cavity through the second interconnect layer and a portion of the conductive plug, thereby removing the connection between the second interconnect layer and the plug.

10 Claims, 11 Drawing Sheets

US 6,369,437 B1

VERTICAL FUSE STRUCTURE FOR INTEGRATED CIRCUITS AND A METHOD OF DISCONNECTING THE SAME

BACKGROUND OF THE INVENTION

1. Field of the Invention

This invention relates to the manufacture of semiconductor devices. More specifically, it relates to semiconductor devices containing fuses that are disposed in a compact interconnect structure and a method for disconnecting them.

2. Background of the Related Art

Custom electronic devices which are made from standard components suffer from several disadvantages. Since several components are required to implement such a custom device, more circuit board space is required than if a custom or semi-custom integrated circuit had been used in place of the standard components. This makes the overall size of the device larger and more expensive. Furthermore, the assembly process is longer, more costly, and prone to reworks or scrap, since more components are used. Further, a larger number of components usually requires more power consumption, which means a larger, heavier, and more expensive power supply. Therefore, the overall size, weight, and cost of the resulting custom device may make it unappealing to the consumer or not competitive when compared to a similar product offered by another company. Therefore, custom or application-specific integrated circuits (ASICs) are frequently used to implement new circuit designs in the place of standard components.

There are several types of ASICs which are available, depending on size, power, and programmability requirements, and volume of devices used. Fully custom devices offer the lowest cost and least amount of power consumption, but are only economical in very large quantities because of the costs of a custom mask set and engineering design time. Semi-custom devices such as gate arrays require a smaller number of custom masks and design time as compared to fully custom devices, but have a larger die size, cost more to produce, and are typically used when needed quantities are not quite as large. Similarities exist in custom and semi-custom devices in that both have relatively long lead times to produce prototypes and production volumes, and the designs are expensive and time consuming to change. Since the non-recurring costs are so large, it is not economical to produce them in small quantities. Other non-custom devices, such as programmable array logic (PALs), field-programmable gate arrays (FPGAs), and programmable logic devices (PLDs), are fabricated as unprogrammed "blanks" which are programmed by the end user as packaged units or after installation onto a circuit board. These non-custom devices have a lower cost basis for smaller quantities, since no custom masks are required. The lead time to produce prototypes and production quantities is short, since the programming is performed near the end of the manufacturing cycle. They are also useful for designs which are expected to undergo revisions, since virtually no programmed material needs to be inventoried. However, these non-custom devices have the drawback of requiring a relatively large amount of die area dedicated to circuitry to perform the programming, and to signal paths to provide flexibility in routing, therefore they are more expensive to fabricate and don't achieve the same programmable capacity as custom devices and gate arrays. In some cases, they also use more power and are slower.

Programming of the non custom programmable devices is sometimes accomplished through the use of disconnectable fuses. In this specification, the word fuse will be used to refer to fuses, anti-fuses, disconnection points, disconnectable links, or any combination of these terms. In certain types of programmable devices using electrically disconnectable or connectable fuses, the fuses in the device which define how the circuit is configured are accessed through the I/O pins on the device package. For techniques which require joining conductive regions together (for example, shorting a P/N junction), an excessive amount of current relative to normal operating conditions is passed through the junction, shorting it and allowing current to pass freely. To disconnect a conductive line, a fuse element in an undesired conduction path is subjected to enough current to heat it to its melting point, causing structural breakdown and creating a disconnection. Both of these methods require a relatively large amount of current to program the device. The transistors for generating these large currents in conventional MOS devices require large channel widths. Furthermore, a certain amount of heat insulation area is required around the fuses to prevent thermal damage to neighboring circuitry. This makes it difficult to achieve high device packing densities using these programming methods. Other devices have fuses which are disconnected through the use of a laser or other radiant energy beam device (hereinafter referred to as a "laser"). For these devices, the laser is used to disconnect the fuses near the end of or after the conclusion of the fabrication process. These laser programmable devices have a smaller die size than the electrically programmable devices, and don't require expensive precision custom masks and long lead times like the custom and semi-custom devices. The laser programmable devices are also economical to produce in smaller quantities compared to custom devices.

In addition to using fuses for the customization of an integrated circuit to give it specific circuit or electrical characteristics, fuses have also been used to (1) repair non-functional devices through the selective deletion of defective portions of the circuitry, or by substituting functional redundant circuitry for the defective portions of the circuitry; and (2) mark the device for identification of characteristics in a manner that is readable visually or electrically, for example serialization of the integrated circuit, or how the device has been configured by the laser.

FIG. 1 shows an array of fuses that can be disconnected by a laser. Fuse body 2 on fuse 1 is irradiated by laser beam 7, which has an energy distribution that is approximately radial Gaussian in nature. This energy distribution results in an effective laser spot size 6, that is the area of the beam which has an energy sufficient to disrupt active circuit elements. This disruption can be physical damage which causes the device to be non-functional, or it could cause performance degradation, such as silicon crystal dislocation which causes current leakage. The two characteristics which define the area requirements for a fuse, also called the fuse cell, are the pitch of the fuses in a group, and the length of the fuse. These two dimensions have a direct bearing on how much die area the fuse cell occupies, and thus the overall die size. The pitch 5 of the fuse cell is the distance from the center of one fuse to the center of the nearest neighboring fuse. This dimension is controlled by the requirement that the spot size 6 not disrupt any other fuses, and is conventionally calculated by adding the diameter of the spot size 6 and two times the maximum expected alignment error in the placement of the spot. The length 8 of the fuse is the sum of the length of fuse body 2 and fuse terminals 3. The length 8 of the fuse 1 is controlled by the need to isolate the thermal energy transmitted to the fuse by the laser from interconnect lines 4 attached to the fuse. Another influence to the area requirements of the fuse is whether circuitry can be routed underneath or in close proximity to the fuse. Most design rules specify that all of the area underneath of the fuse, and a certain area around it, be free of active circuitry to protect it from damage. Some designs provide for a barrier at another level between the fuses and the active circuitry and thus utilize some of the area.

As is also well known in the prior art, laser type fuses can alternatively be disconnectable by photolithographic techniques combined with etching to remove a section of the fuse, thus forming a disconnection. Photoresist layer 21 in FIG. 2 is patterned to make a hole 22 in the photoresist over the fuse 24. Well-known etching techniques are then used to etch through the fuse 24, completing the disconnection. As can be seen from FIG. 2, the disconnection can be made cleanly and thoroughly without a risk of damage to any underlying circuitry 25, which would not typically be routed under the fuse, but is shown here to illustrate that such routing can take place if desired. FIG. 3 illustrates that a smaller disconnection hole 31 on fuse 32 permits a smaller pitch 5. Since the thermal isolation requirements are not needed when using photolithographic techniques, the length of the fuse can also be shortened. The above-mentioned methods of disconnecting fuses can be used, in varying degrees, to reduce required fuse cell area and thus permit a smaller fuse cell and an advantageously smaller die. Accordingly, it is desirable to have a fuse design that makes most efficient use of these disconnection methods in order to increase the packing density of the fuses and produce a smaller die size, and a method of disconnecting that allows for such increased packing density.

SUMMARY OF THE INVENTION

It is an object of this invention to decrease the amount of space required for a fuse, or an array of fuses which form a specific circuit such as an AND array, thus reducing the overall size of the integrated circuit.

It is another object of the present invention to provide a method of disconnecting fuses that allows reduction in the overall size of the integrated circuit The present invention achieves the above objects, among others, by providing a vertical fuse structure and method for customization of integrated circuits containing such a fuse structure that provides for a more densely packed and thus smaller programmable integrated circuit. In a preferred embodiment, the interconnect structure is fabricated by forming a first interconnect layer, forming an insulating layer over the first interconnect layer in which substantially vertically-oriented vias are patterned in contact with the first interconnect layer, filling the vias with a conductive plug, and forming a second inter-connect layer over the insulating layer in contact with the conductive plug. The vertical interconnect structure is preferably disconnected by forming a narrow, substantially vertical disconnect cavity through the second interconnect layer and a portion of the conductive plug, thereby removing the connection between the second interconnect layer and the plug.

Thus, the area required for the link is only as large as the cross-sectional area of the plug at the point of disconnection. Since the cross-sectional diameter of the plug is typically smaller than the width of the line connecting to it, the disconnection can be made without breaking the continuity of the line. This feature has benefits in optimizing the layout of the design to provide packing densities that would not be achievable with conventional fuse designs.

BRIEF DESCRIPTION OF THE DRAWINGS

The above and other objects, features, and advantages of the present invention are further described in the detailed description which follows, with reference to the drawings by way of non-limiting exemplary embodiments of the present invention, wherein like reference numerals represent similar parts of the present invention throughout several views and wherein:

FIG. 4b is a cross-sectional view of the interconnect structure of FIG. 4a;

DETAILED DESCRIPTION OF THE PREFERRED EMBODIMENTS

Figure 4A:
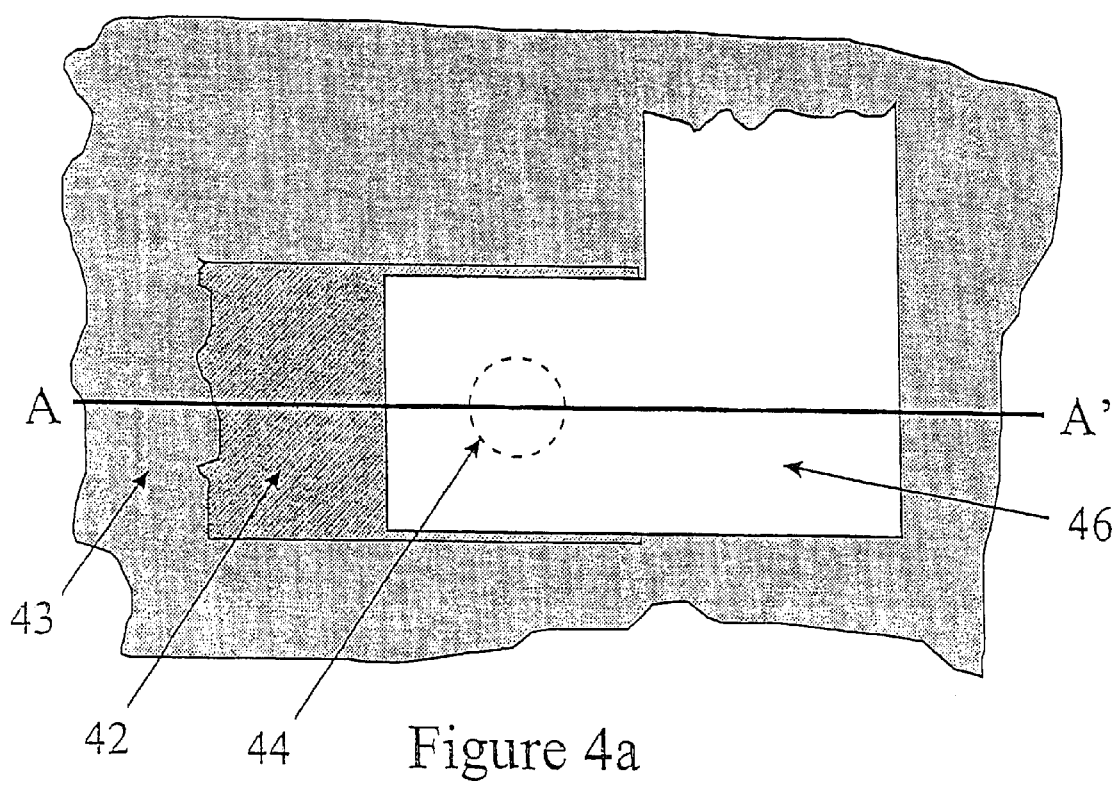
FIG. 4a is a top plan view showing the construction of a preferred disconnect interconnect structure or "fuse" according to the invention.
Figure 4B:
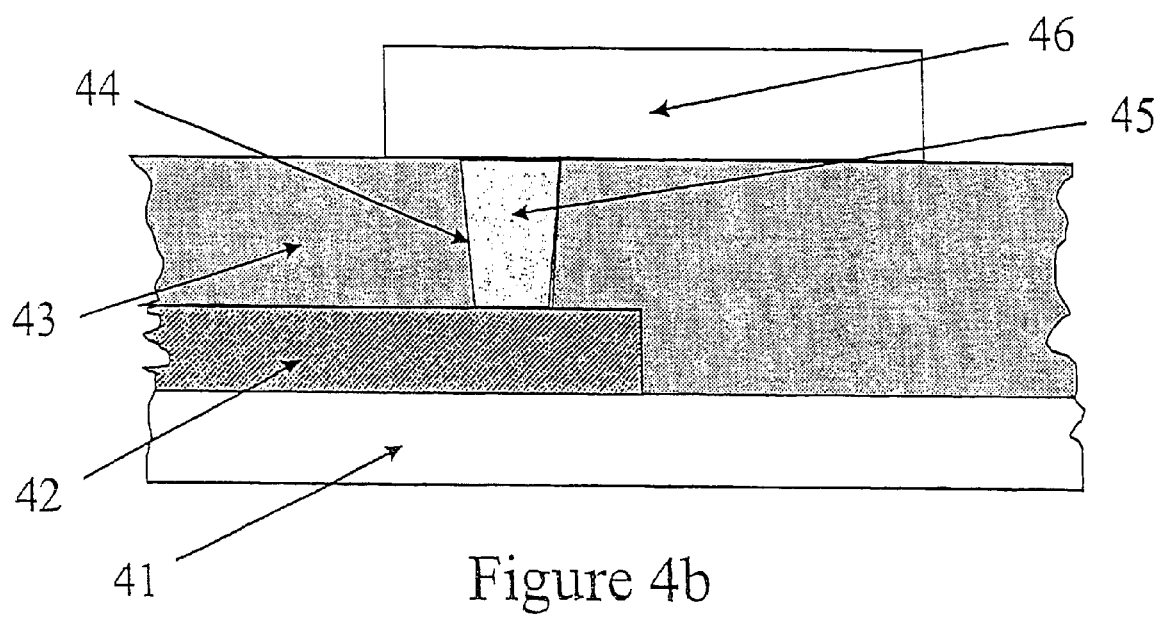

FIGS. 4a and 4b show respectively a top view and cross-sectional view, the cross-section of FIG. 4b taken along the line A–A' from FIG. 4a, which shows an interconnect structure deposited on a substrate of active circuitry. The layout in FIG. 4a is commonly used for interconnecting two conductive layers in an integrated circuit. Substrate 41 is initially formed and underlies first interconnect layer 42, which may be polysilicon, tungsten silicide, aluminum, titanium, tungsten, or other alloys or combinations of these materials. For simplicity, substrate 41 is shown as a monolithic layer, but it should be recognized that the substrate 41 could include various types of circuit elements. For example, circuit elements or active circuitry such as transistors, diodes, resistors, capacitors, other interconnect layers or insulating layers, or even a P/N-well in an N/P-type semiconductor substrate could be used instead of the substrate 41. An insulating material such as doped or undoped silicon dioxide 43 is formed over first interconnect layer 42 and patterned to form via 44. A filler material for via 44, such as tungsten plug 45, is used to fill the via and provide a vertical electrical connection to a second interconnect layer 46.

Figure 5:
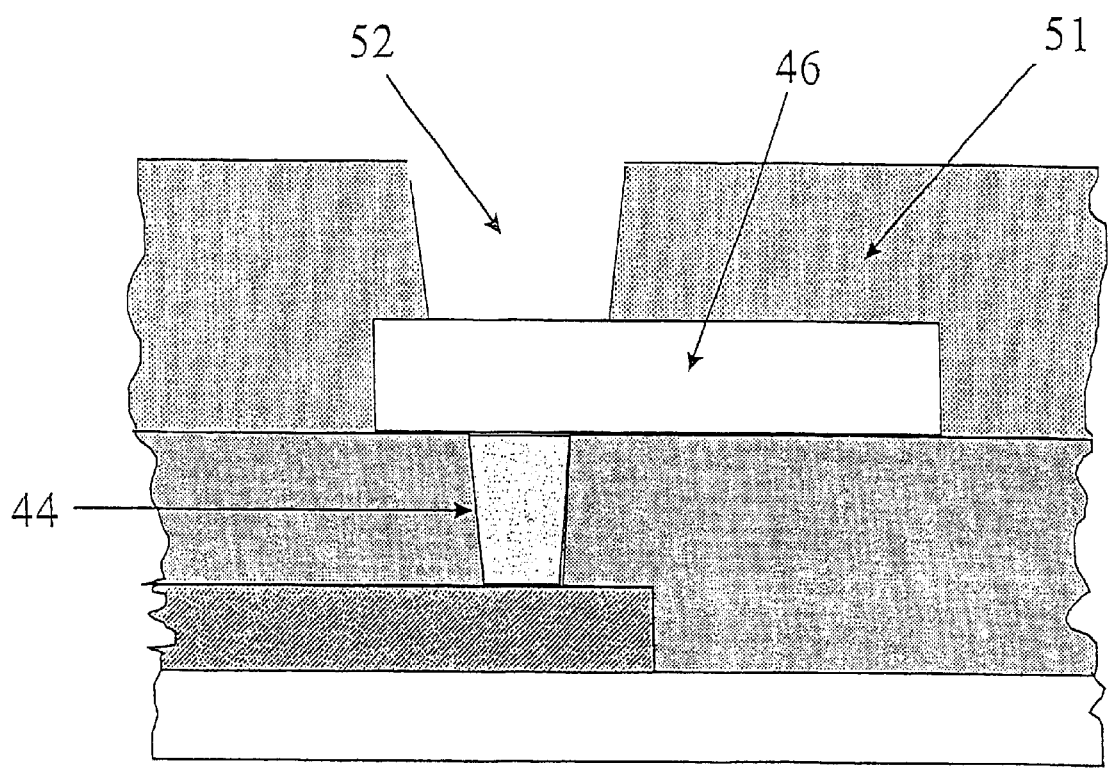
FIGS. 5–7 illustrate a method of disconnecting the interconnect structure of FIGS. 4a and 4b according to the present invention.

It is recognized by the present invention that this structure provides a disconnectable conductive path between the first interconnect layer 42 and the second interconnect layer 46 through plug 45. A method of disconnecting this conductive path will now be described with reference to FIGS. 5–7. As shown in FIG. 5 at the time that the circuit is ready for customization or repair, a layer of photoresist 51 is applied. A disconnect hole 52 is formed in the photoresist 51 using well-known photolithographic techniques. It is advantageous to design the top surface width of the second interconnect layer 46 to be large enough so that the disconnect hole 52 does not overlap its side edge and thereby expose any top surface portion of insulating material 43 prior to initiating the etch that will be subsequently described. This will prevent first interconnect layer 42 from being subsequently and undesirably etched. The minimum top surface width of the disconnect hole 52 is determined by adding the nominal diameter for the via 44, the maximum sizing error for the via 44, and the maximum registration error for the placement of disconnect 52 over via 44.

Figure 6:
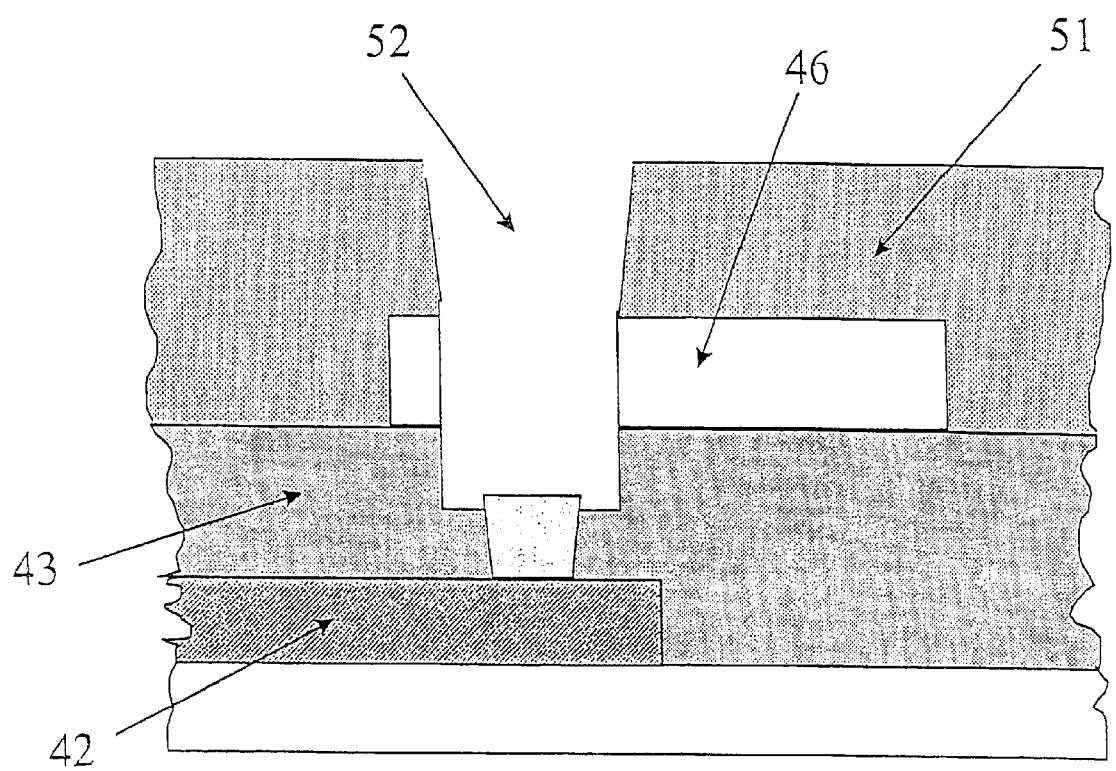
Figure 7:
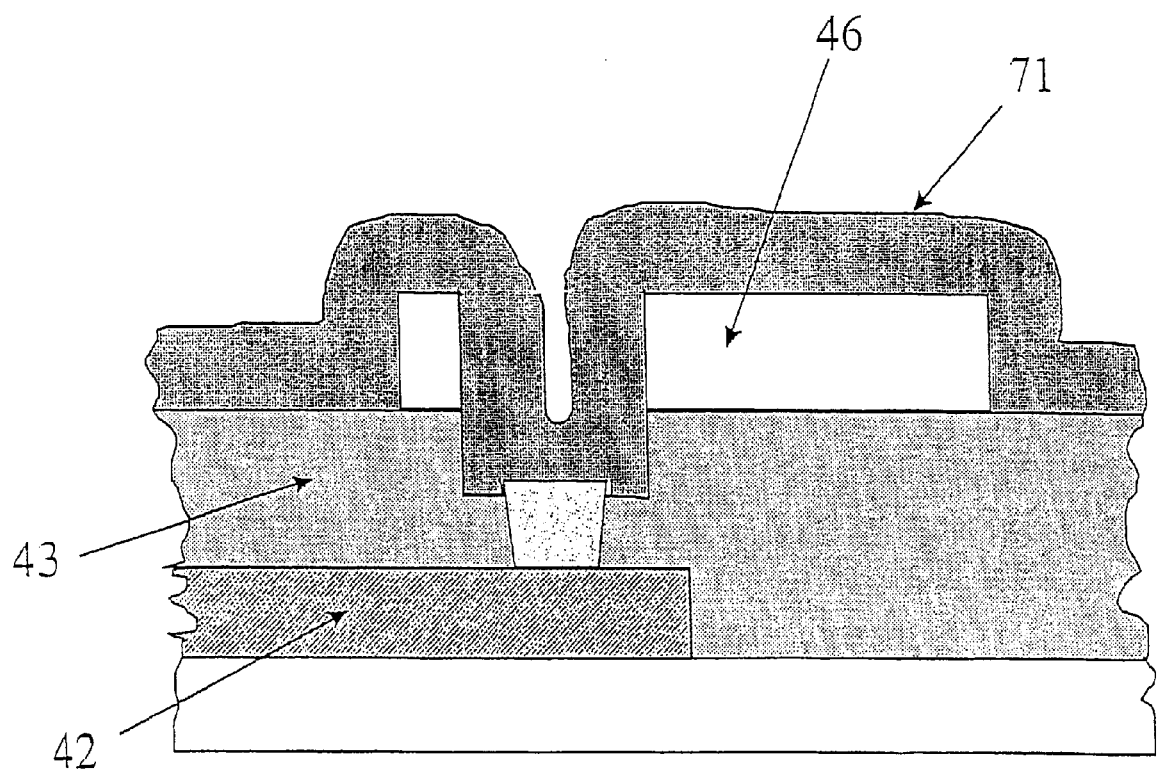

As shown in FIG. 6, the exposed portion of second interconnect layer 46 is completely etched and the entire top surface of plug 45A is etched to result in a disconnect cavity 61 by a process which removes second interconnect layer 46 and the plug 45 at a rate which is substantially higher than that of photoresist 51. As shown, if a stub 45B of the plug 45 remains after the etch is complete, a complete electrical disconnection will have been achieved. It is most desirable, however, to remove the entire plug 45, thereby not leaving any stub 45B, while ensuring that first interconnect layer 42 is not damaged. By removing the entire plug 45, there will not remain the stub 45B, which could, at the conclusion of the etch, break off and cause shorting or contamination problems. For example, a plug which is formed from tungsten can be further processed with hydrogen peroxide to dissolve the plug while leaving the remainder of the circuit unaffected. Thereafter, as shown by FIG. 7, the photoresist 51 is removed and a passivation layer 71 of silicon nitride or other suitable material is used to seal the disconnect cavity 61 and provide a moisture barrier and physical protection to the remainder of the die.

It is desirable to form the vias 44 with straight sidewalls as opposed to a sloped profile so that the diameter at the top of the via is maintained at the minimum dimensions allowed by the design rules. This permits the greatest packing density of the fuses. It is further desirable to use a material for the plug 45 which is different in composition than that used for the second interconnect layer 46, such that the etch selectivity of the second interconnect layer 46 to the plug 45 is approximately equal to the selectivity of the second interconnect layer 46 and the underlying insulating layer 43. If the material for the plug 45 is substantially less selective than the insulating material used to create insulating layer 43, the etchant can penetrate all of the plug material and damage the first interconnect layer 42. If the plug material is substantially more selective, the stump 45B of plug material may remain at the conclusion of the etch which could break off and cause shorting or contamination problems as previously mentioned. It is, however, within the scope of the present invention to use a disconnect cavity 61 that has larger, non-critical dimensions, such that non-precision materials and equipment can be used for the photomask, to create the patterns on the photomask, and to transfer the disconnect hole pattern from the mask to the wafer. This requires increasing the size of the second interconnect layer pattern so that the disconnect hole 52 will fall on the second interconnect layer 46 and not misalign such that it overlaps its side edge, as has been previously discussed. Alternatively, the disconnect hole 52 can be made to a minimum size such that the packing density of the fuses is increased, reducing the overall size of the die.

While the disconnection method according to the present invention was described above using a photolithographic technique that etched away material necessary to obtain a complete disconnection, the present invention can also be implemented using a laser removal technique, in which the laser spot is directed so as to remove the plug 45, and the material from the second interconnect layer 46 disposed above. When using a laser removal technique, photoresist layer 51 is not needed, but the laser spot will need to be directed to the appropriate location on the semiconductor device. It should be noted, however, that the use of a photolithographic disconnection technique is preferred, since when a laser removal method is used, the thermal energy that is created at the plug 45 is higher than that which is desired, which has the potential for adversely affecting other interconnects.

Figure 9:
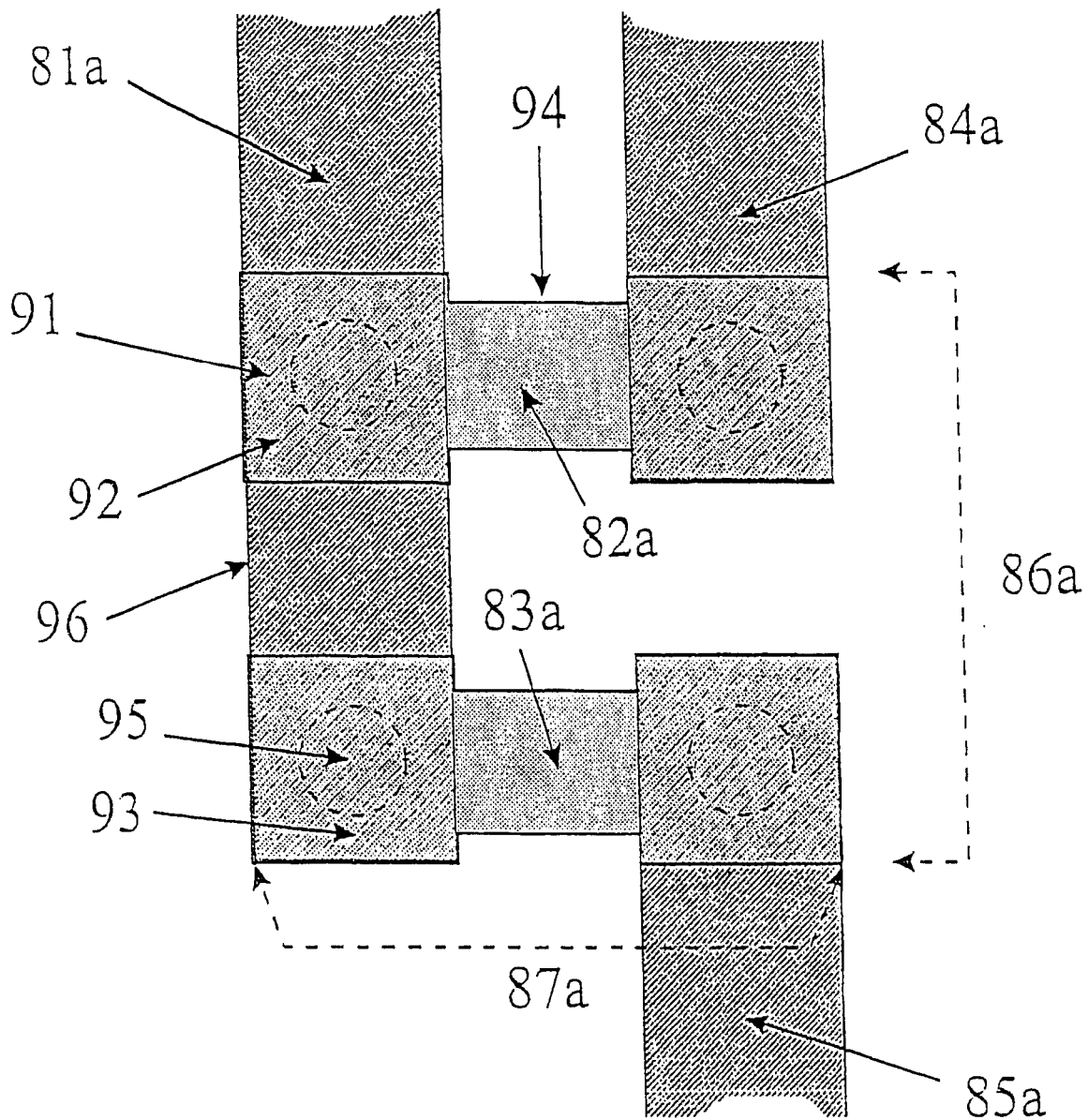
FIG. 9 illustrates dimensions needed for fuses when conventional fuses are disconnected using a photolithographic technique.
Figure 10:
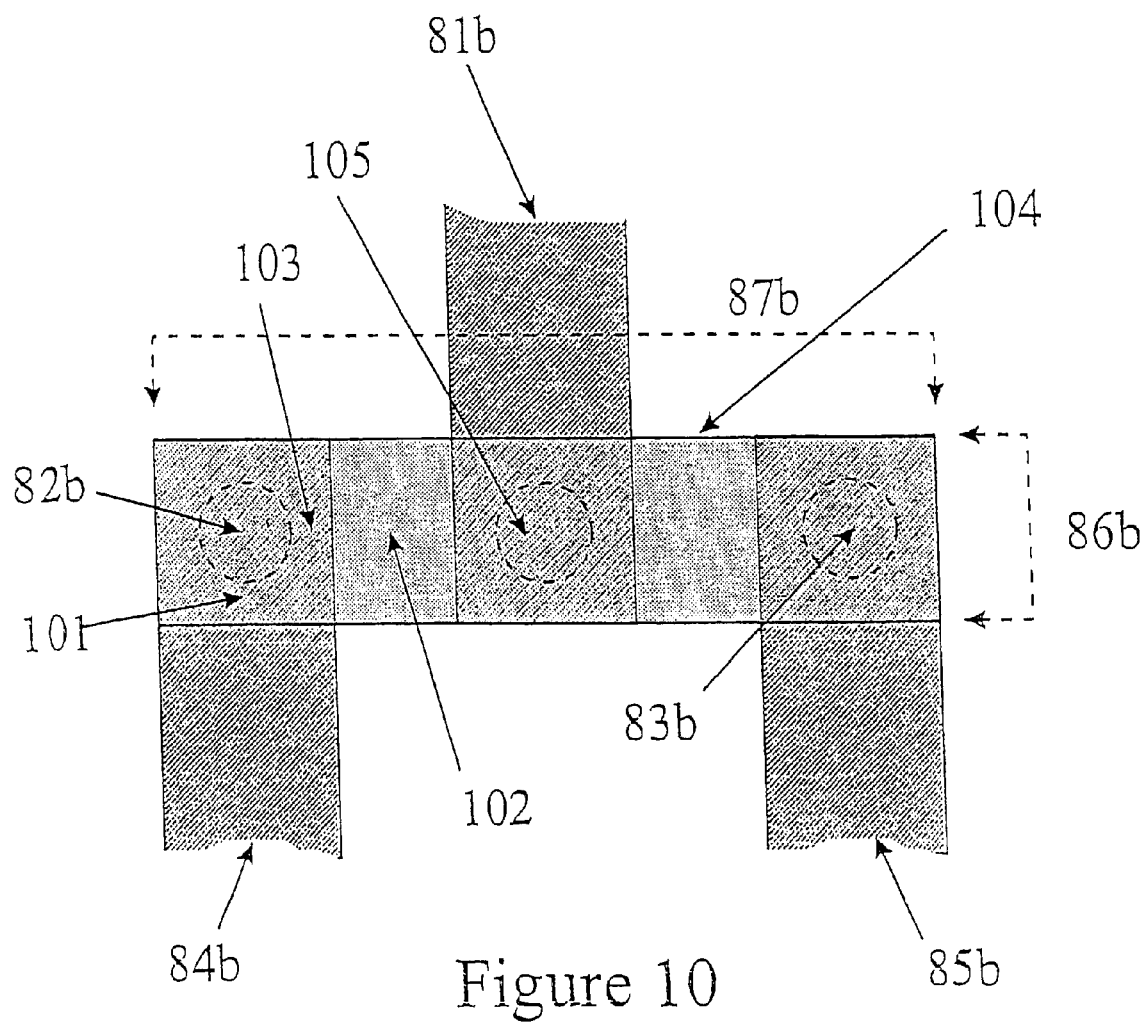
FIG. 10 illustrates dimensions needed for fuses when using the structure and disconnection techniques according to the present invention.

Using the interconnect method of the present invention as described above allows a substantial increase in the packing density of fuses in a circuit. This will now be explained with reference to FIGS. 8–10, in which FIG. 8 illustrates the area needed for disconnecting fuses using conventional laser or photo lithographic techniques, FIG. 9 illustrates the area needed for disconnecting fuses using only photolithographic technique, and FIG. 10, illustrates the area needed for disconnecting fuses using the described techniques of the present invention.

Figure 8:
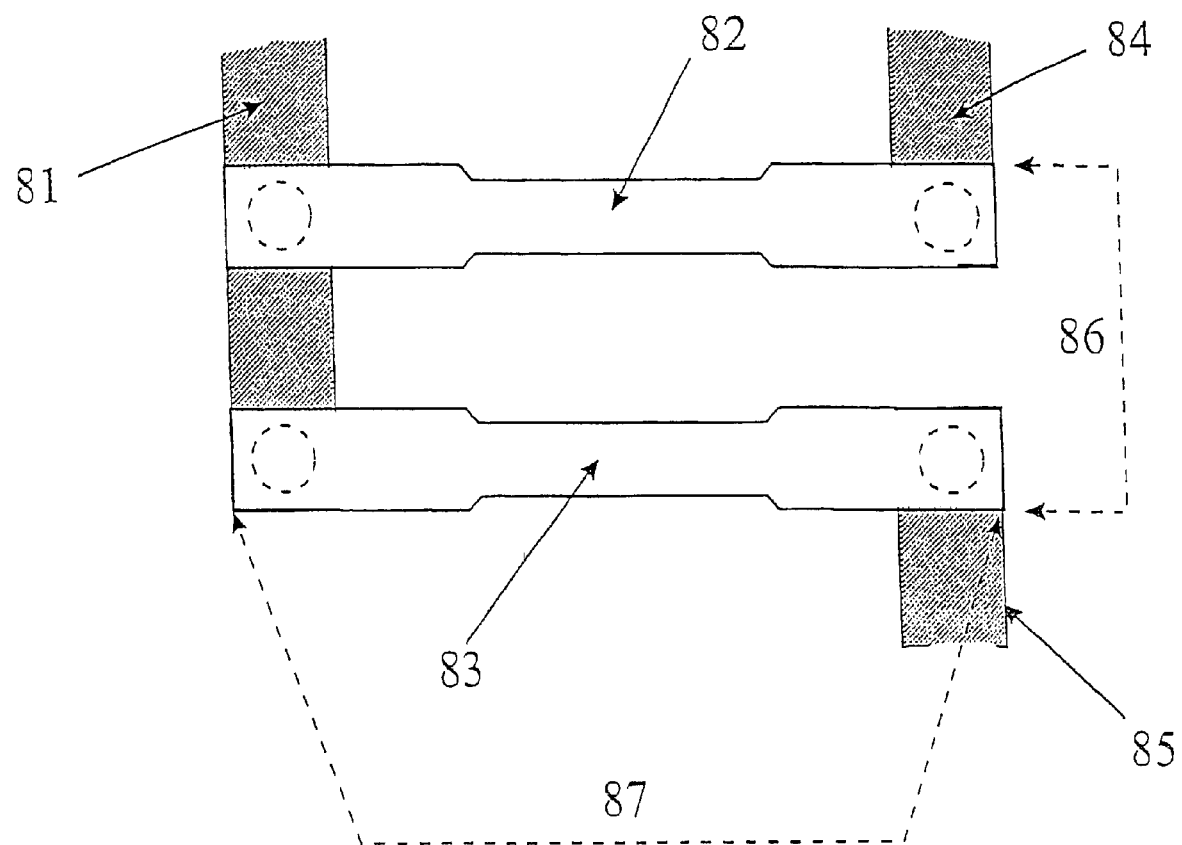
FIG. 8 illustrates dimensions needed for fuses when conventional fuses are disconnected using laser or photolithographic techniques.

In FIG. 8, a fuse structure using a conventional fuse design is shown. As shown, the disconnectable links are designed so that the link runs parallel to the plane of the die. This requires some amount of lateral space to be dedicated to this link beyond that required to make connections to other circuitry. Further, the disconnection hole must be no smaller than the width of the link itself, which in turn can be no smaller than the minimum design rule width for that interconnect layer. Thus, a signal line 81 is connected to signal lines 84 and 85 through conventional fuses 82 and 83, respectively. Signal line 84 may carry a "high" logic state signal, while line 85 may carry a "low" logic state. During the fuse configuration process, fuse 82 would be disconnected if the transmission of a "low" logic state from line 85 is desired. Alternatively, fuse 83 would be disconnected if the transmission of a "high" logic state from line 84 is desired. One width dimension 86 required for this fuse structure is the sum of the fuse pitch and the width of a single fuse. In this example, the following drawn dimensions are given:

| Fuse pitch: | 7.0 μm |
|---|---|
| Fuse width: | 3.5 μm | for a total of 10.50 μm. The length dimension 87 required for this fuse structure is the length of the fuse, which is 14.00 μm in this example. Thus, the area required to form this fuse structure using a conventional fuse design is dimension 86 multiplied by dimension 87, or 147.0 μm². The fuse structure illustrated in FIG. 8 takes into account fuse rules that thus allow these fuses to be disconnected using either a laser or conventional photolithographic masking and etch processes.

Figure 1:
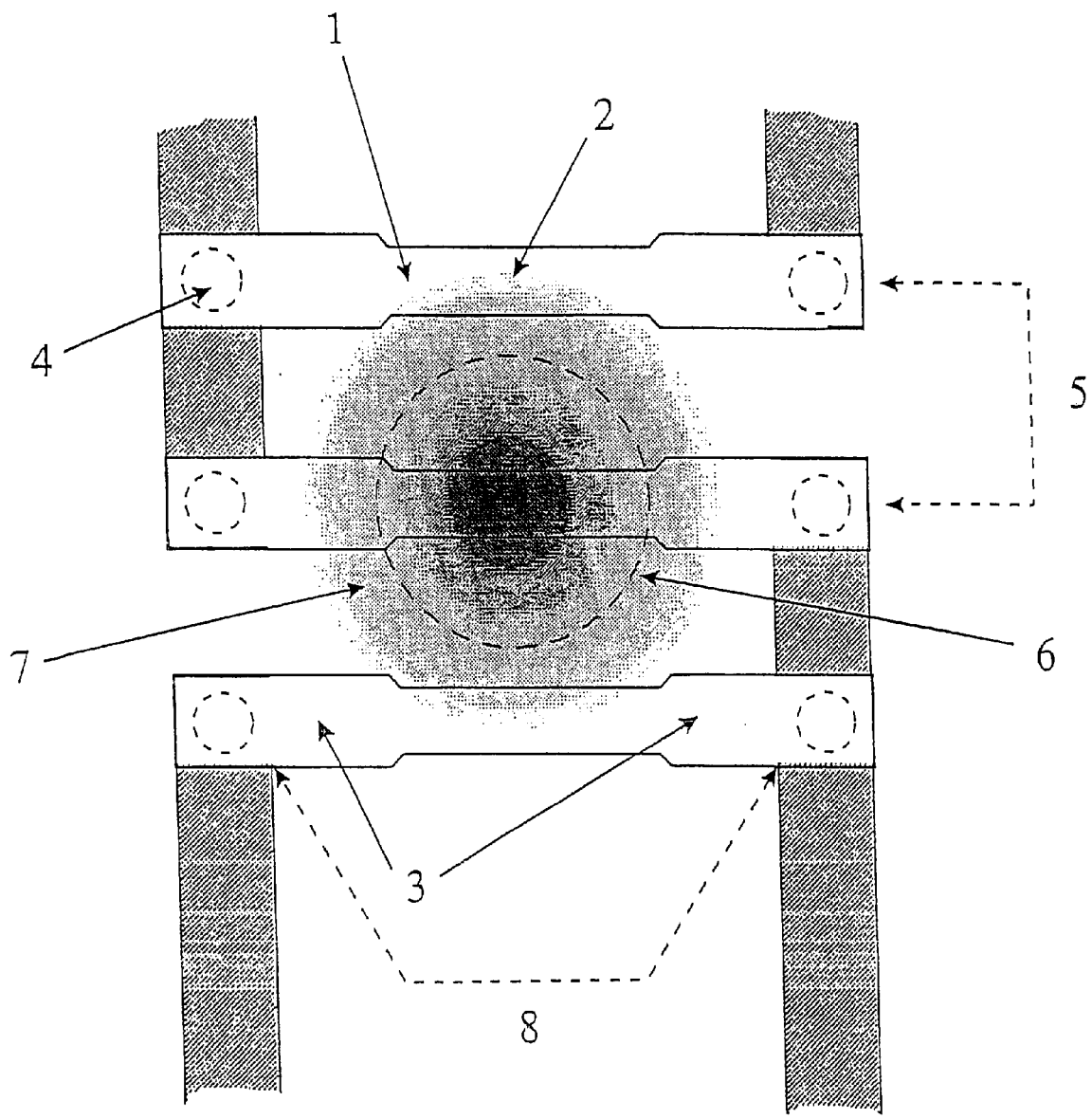
FIG. 1 is a top plan view of a conventional fuse array within an integrated circuit device that illustrates the use of a laser to disconnect a conventional fuse within the fuse array.
Figure 2:
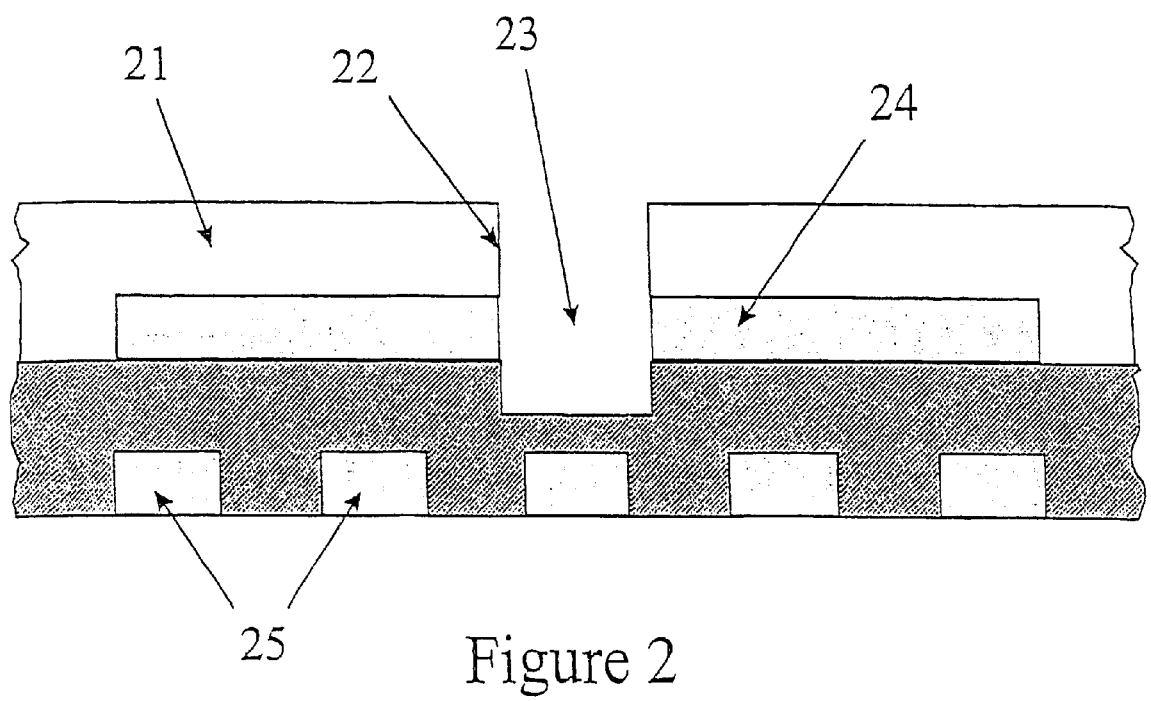
FIG. 2 is a side elevation cutaway view of a conventional fuse structure within an integrated circuit device that illustrates the use of photolithographic techniques combined with etching to disconnect a conventional fuse.
Figure 3:
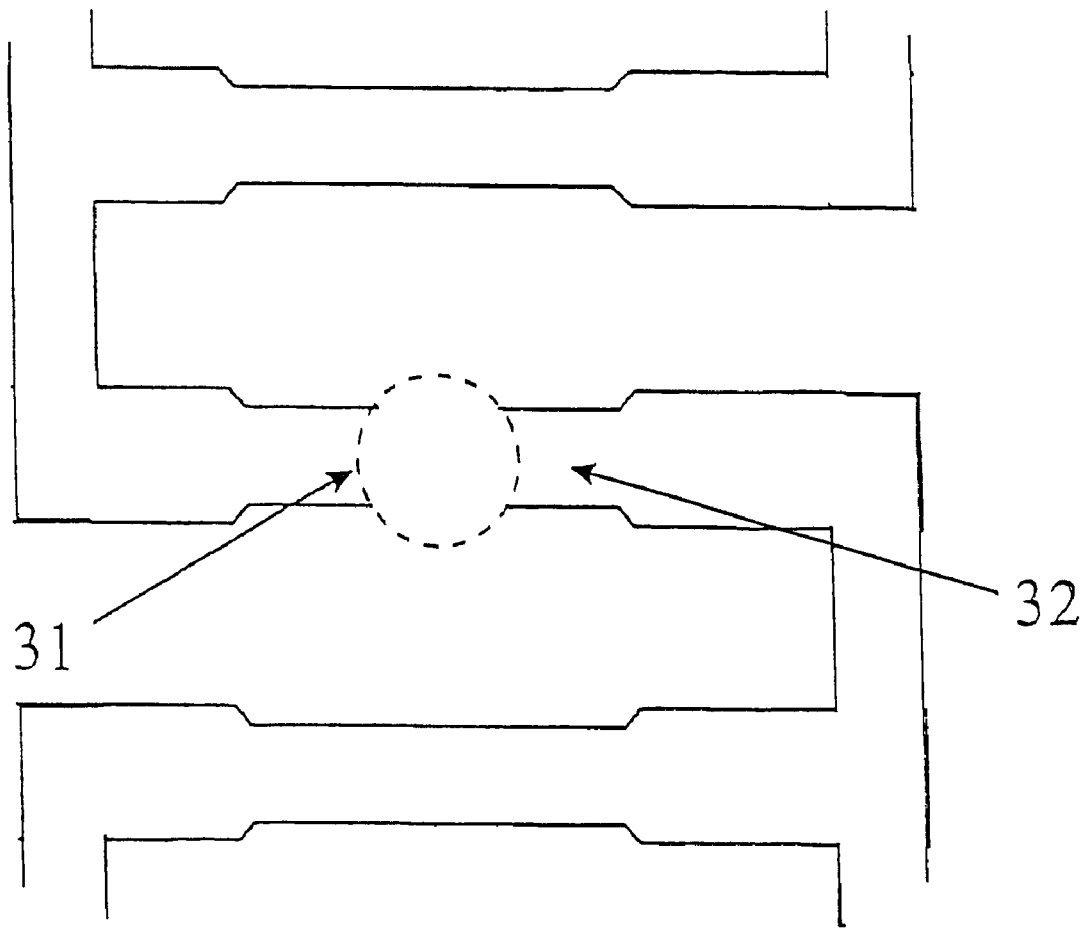
FIG. 3 is a top plan view of a conventional fuse array illustrating the ability to design smaller dimension fuses due to the use of photolithographic techniques combined with etching to disconnect a conventional fuse within the fuse array.

As is shown in FIG. 3, the dimensions of the fuse can be reduced substantially if the fuse is disconnected using only by a photolithographic process. FIG. 9 shows the same fuse structure with the dimensions optimized for a photolithographic process. The equivalent elements of the conventional fuse structure shown in FIG. 8 are numbered the same in FIG. 9 with the addition of the suffix "a". The length dimension 87a of the fuse structure is the sum of the fuse body 94, plus four times the distance 91 from the edge of the via 95 to the edge of the upper conductive layer 92, plus two times the diameter of via 95. In this example, the following drawn dimensions are given:

| | |
|---|---|
| Fuse body 94: | 2.4 $\mu$m |
| Distance 91: | 0.8 $\mu$m |
| Via 95: | 1.2 $\mu$m | for a total of 8.0 $\mu$m The width dimension 86a is the sum of minimum space 96 between features on the second interconnect layer 92, plus four times the distance 93 from the edge of via 95 to the edge of the upper conductive layer 92, plus two times the diameter of via 95. In this example, the following drawn dimensions are given:

| | |
|---|---|
| Minimum space 96: | 1.8 $\mu$m |
| Distance 93: | 0.8 $\mu$m |
| Via 95: | 1.2 $\mu$m | for a total of 7.4 $\mu$m. Thus, the area required to form this fuse structure using a fuse design optimized for a masking process is dimension 86a multiplied by dimension 87a or 59.2 $\mu$m$^2$.

Alternatively, as in FIG. 10, the same fuse circuit is formed using the present invention. The equivalent elements of the conventional fuse structure shown in FIG. 8 are numbered the same in FIG. 10 with the suffix "b". It is noted that because disconnection is made at the plug, as previously described, that the layout of the circuit can be efficiently modified, and, therefore, the number of plugs 45 needed can be reduced. As modified, the dimension 86b of the fuse structure would be the diameter of the fuse 82b plus two times the distance 101 from the edge of the fuse 82b to the edge of the upper conductive layer 102. In this example, the following drawn measurements are given:

| | |
|---|---|
| Fuse diameter 82b: | 1.2 $\mu$m |
| Distance 101: | 0.8 $\mu$m | for a total of 2.8 $\mu$m. The other dimension 87b is the sum of three times the diameter of the fuse 82b, plus six times the distance 103 from the edge of the fuse 82b to the edge of the upper conductive layer 102, plus two times the minimum space 104 between signal lines 81b and 84b. In this example, the following drawn dimensions are given:

| | |
|---|---|
| Fuse diameter 82b: | 1.2 $\mu$m |
| Distance 102: | 0.8 $\mu$m |
| Minimum space 104: | 1.8 $\mu$m | for a total of 12.0 $\mu$m. Thus, the area required to form this fuse structure using a fuse design of the present invention is dimension 86b multiplied by dimension 87b or 33.6 $\mu$m$^2$. The area required to implement the fuse design of the present invention is less than one-quarter of the area using a conventional fuse design, and less than 60% of the area using a fuse design optimized for a photolithographic process.

It is also a feature of the present invention that a disconnection can be made to a fuse within the array rather than at the ends as described above, without disturbing the continuity or current-carrying capability of the second interconnect layer in a way that would be disruptive to the circuit. For example, in the previous example shown in FIG. 10, the input signal lines 84b and 85b bracket output line 81b. However, it may become advantageous to lay out the array such that lines 81b and 84b are the input lines and line 85b is the output line. In this case, the fuse 105 for line 81b can be disconnected while maintaining the connection between line 84b and 85b through second interconnect layer 102. It may, however, be necessary to increase dimension 86b to accomplish this, depending on the design rules that are used.

While the present invention has been described herein with reference to particular embodiments thereof, a latitude of modification, various changes and substitutions are intended in the foregoing disclosure, and it will be appreciated that in some instances some features of the invention will be employed without a corresponding use of other features without departing from the spirit and scope of the invention as set forth.

We claim:

1. An interconnect apparatus for a fusible link array in an integrated circuit comprising:
    a first signal line;
    a conductive interconnect;
    a second signal line;
    insulating material disposed between the first signal line and the conductive interconnect and the second signal line and the conductive interconnect;
    a first plug disposed within a first portion of the insulating material that electrically connects the first signal line to the conductive interconnect; and
    a second plug disposed within a second portion of the insulating material different from the first portion which originally electrically connected the conductive interconnect to the second signal line, and wherein subsequently a portion of the second plug has been removed, thereby preventing an electrical connection between the conductive interconnect and the second signal line.

2. An apparatus according to claim 1 wherein the first signal line and the second signal line are disposed on a same semiconductor layer.

3. An apparatus according to claim 1 wherein the first signal line and the second signal line are disposed on a different semiconductor layer.

4. An apparatus according to claim 1 further including:
    a third signal line;
    insulating material disposed between the third signal line and the conductive interconnect;
    a third plug disposed within a third portion of the insulating material that electrically connects the third signal line to the conductive interconnect.

5. An apparatus according to claim 4, wherein a portion of the third plug has been removed, thereby preventing an electrical connection between the conductive interconnect and the third signal line.

6. An apparatus according to claim 1 wherein the first and second plugs are disposed in vias formed in the insulator, wherein the electrical disconnection is caused by a disconnect cavity, and the first and second plugs and the disconnect cavity have substantially vertical sidewalls.

7. An apparatus according to claim 1 wherein an etching characteristic of the insulating material is matched to an etching characteristic of the second plug.

8. An apparatus according to claim 1 wherein substantially completely all of the second plug is removed to prevent the electrical connection between the conductive interconnect and the second signal line.

9. An interconnect apparatus for a fusible link array in an integrated circuit comprising:

an input line;

an output line that crosses the input line at a predetermined position, the input line and the output line disposed on different semiconductor layers;

an insulating layer disposed between the input line and the output line;

a plug disposed at the predetermined position and within a first portion of the insulating material between the input line and the output line, the plug originally providing an electrical connection of the input line to the output line, and wherein subsequently a portion of the plug has been removed, thereby preventing the electrical connection between the input line and the output line.

10. An apparatus according to claim 9, wherein substantially completely all of the plug is removed to prevent the electrical connection between the input line and the output line.

* * * * *